(12) United States Patent
Basavanhally et al.

(10) Patent No.: US 7,560,817 B2
(45) Date of Patent: Jul. 14, 2009

(54) INTERCONNECT INCLUDING A PLIABLE SURFACE AND USE THEREOF

(75) Inventors: Nagesh R. Basavanhally, Skillman, NJ (US); Raymond A. Cirelli, Hillsborough, NJ (US); Omar D. Lopez, Scotch Plains, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 581 days.

(21) Appl. No.: 11/312,061

(22) Filed: Dec. 20, 2005

(65) Prior Publication Data

US 2006/0097252 A1 May 11, 2006

Related U.S. Application Data

(63) Continuation-in-part of application No. 10/816,527, filed on Apr. 1, 2004, now Pat. No. 7,327,037.

(51) Int. Cl.
*H01L 23/48* (2006.01)

(52) U.S. Cl. .......................... 257/773; 438/666

(58) Field of Classification Search ............... 257/773, 257/779; 438/612, 666
See application file for complete search history.

(56) References Cited

U.S. PATENT DOCUMENTS

| 6,185,961 | B1 | 2/2001 | Tonucci et al. | |
|---|---|---|---|---|
| 6,297,063 | B1 | 10/2001 | Brown et al. | |
| 6,340,822 | B1 | 1/2002 | Brown et al. | |
| 6,383,923 | B1 | 5/2002 | Brown et al. | |
| 6,407,922 | B1 | 6/2002 | Eckblad et al. | |
| 6,828,685 | B2 | 12/2004 | Stasiak | |
| 7,301,779 | B2 * | 11/2007 | Honlein et al. | 361/772 |
| 7,327,037 | B2 * | 2/2008 | Basavanhally et al. | 257/777 |
| 2003/0175154 | A1 | 9/2003 | Hsu et al. | |
| 2005/0066883 | A1 | 3/2005 | Dubrow et al. | |
| 2005/0224975 | A1 | 10/2005 | Basavanhally et al. | |

FOREIGN PATENT DOCUMENTS

| EP | 1 100 297 | 5/2001 |
|---|---|---|
| EP | 1 320 111 | 6/2003 |
| WO | WO 02/099845 | 12/2002 |

OTHER PUBLICATIONS

A.K. Geim, et al. ; "Microfabricated Adhesive Mimicking Gecko Foot-Hair"; Nature Materials/vol. 2/Jul. 2003/www.nature.com/naturematerials; pp. 461-463.

* cited by examiner

*Primary Examiner*—Mark Prenty

(57) ABSTRACT

The present invention provides an interconnect. The interconnect comprises a pliable surface having a plurality of nanostructures disposed thereon, the pliable surface configured to allow the plurality of nanostructures to at least partially conform to a surface when the nanostructures come into contact therewith.

20 Claims, 6 Drawing Sheets

ND A PLIABLE
INTERCONNECT INCLUDING A PLIABLE SURFACE AND USE THEREOF

CROSS-REFERENCE TO RELATED APPLICATIONS

This Application is a continuation-in-part of U.S. application Ser. No. 10/816,527 filed on Apr. 1, 2004, which issued into U.S. Pat. No. 7,327,037, entitled "HIGH DENSITY NANOSTRUCTURED INTERCONNECTION," commonly assigned with the present invention and incorporated herein by reference.

TECHNICAL FIELD OF THE INVENTION

The present invention is directed, in general, to an interconnect including a pliable surface and method of use thereof.

BACKGROUND OF THE INVENTION

Methods for electrically or thermally connecting electronics components onto, for example, a conductor or semiconductor substrate, are well known in the art. For example, both thermo-compression and solder bump bonding methods have been used to create connections between, illustratively, components in optoelectronic devices and/or microelectromechanical (MEMS) devices. FIG. 1 shows one illustrative method of forming a thermo-compression bond for use as a thermal or electrical interconnection. Specifically, in that FIGURE, component 110 has a layer of a material 120, typically gold, which is suitable for compression bonding. In order to bond component 110 with illustrative substrate 150, layer 120 on component 110 is, for example, lowered in direction 140 in a way such that it is brought into contact with a layer 130 of material, once again illustratively gold, on substrate 150. A sufficient temperature (e.g., 300 degrees Celsius) and pressure (e.g., 10 kgf/mm² of gold area) are applied such that the gold layers deform and bond together. However, while such gold-gold thermo-compression bonding is useful in many regards, the temperatures and pressures required to create such a bond may damage sensitive electronic elements, such as transistors. As components become smaller and smaller (e.g., in MEMS devices), relatively high temperatures and pressures become more likely to cause damage to the increasingly fragile components.

FIG. 2 depicts another conventional method of thermally or electrically connecting two electronic components. Specifically, in that FIGURE, substrate 210 is, for example, a surface of an electronics chip such as a microprocessor in a MEMS package. Solder bumps 220 are created on the chip using well-known methods. In order to create an electrical or thermal connection between the chip and a substrate, such as a printed wire board, the solder bumps 220 are brought into contact with connection points and are then heated until they reflow. The bumps are then brought into contact with connection points on the exemplary printed wire board. Such solder bump methods are well-known as being very advantageous in forming electrical and thermal connections. However, once again, the temperature necessary to reflow the solder may damage components in the package. Additionally, solder bumps have been limited by certain design considerations. Specifically, such bumps must be above a certain size, typically larger than 20-25 microns in diameter, in order to achieve the desired bump height. Additionally, since it is undesirable to have solder bumps come into contact with one another when the solder is reflowed, solder bumps must typically be separated by a minimum distance, for example, 50 microns from the center of one bump to the center of an adjacent bump.

Finally, one other prior method for bonding two components together is to use a thermally and/or electrically conducting adhesive. However, such adhesives are typically subject to out-gassing as they cure, which may introduce damaging organic material on critical optical devices (e.g., lasers, detectors, etc.) and MEMS components that can interfere with proper performance of small components.

Embodiments of the present invention provide an improved bond and a method of manufacture therefore, whether it is thermal, electrical or otherwise, that substantially reduces the problems associated with the above-mentioned bonds.

SUMMARY OF THE INVENTION

To address the above-discussed deficiencies of the prior art, the present invention provides an interconnect. The interconnect comprises a pliable surface having a plurality of nanostructures disposed thereon, the pliable surface configured to allow the plurality of nanostructures to at least partially conform to a surface when the nanostructures come into contact therewith.

The present invention further provides a method for interconnecting multiple surfaces. The method comprises contacting a plurality of nanostructures disposed on a pliable surface with a surface, wherein the pliable surface is configured to allow the plurality of nanostructures to at least partially conform to the surface.

BRIEF DESCRIPTION OF THE DRAWINGS

The invention is best understood from the following detailed description when read with the accompanying FIGUREs. It is emphasized that, in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the recognition that nanostructures may, advantageously, be used to couple two or more surfaces together, whether it be physically, electrically, thermally or any combination thereof. Within this recognition is the appreciation that in order to obtain superior coupling, again whether it is physically, electrically, thermally or any combination thereof, a desired number of the nanostructures (e.g., a substantial number of the nanostructures) must appropriately contact the opposing surface.

Based upon the aforementioned appreciation, as well as substantial experimentation, the present invention acknowledges that the degree of coupling of the nanostructures to an opposing surface is at least partially a function of the surface roughness or one or both of the nanostructures and the opposing surface. For instance, the present invention acknowledges that because the nanostructures are themselves coupled to a rigid surface, they are generally unable to conform to an opposing rough surface when the two are brought together. For similar reasons, nanostructures have their own surface roughness are generally unable to conform to an opposing surface, whether rough or not. In those situations wherein the surface roughness is significant enough, the coupling of the nanostructures to the opposing surface is compromised. Accordingly, the present invention acknowledges that by forming the plurality of nanostructures on a pliable surface, the pliable surface will allow the plurality of nanostructures to at least partially conform to the surface they are to contact.

Figure 1:
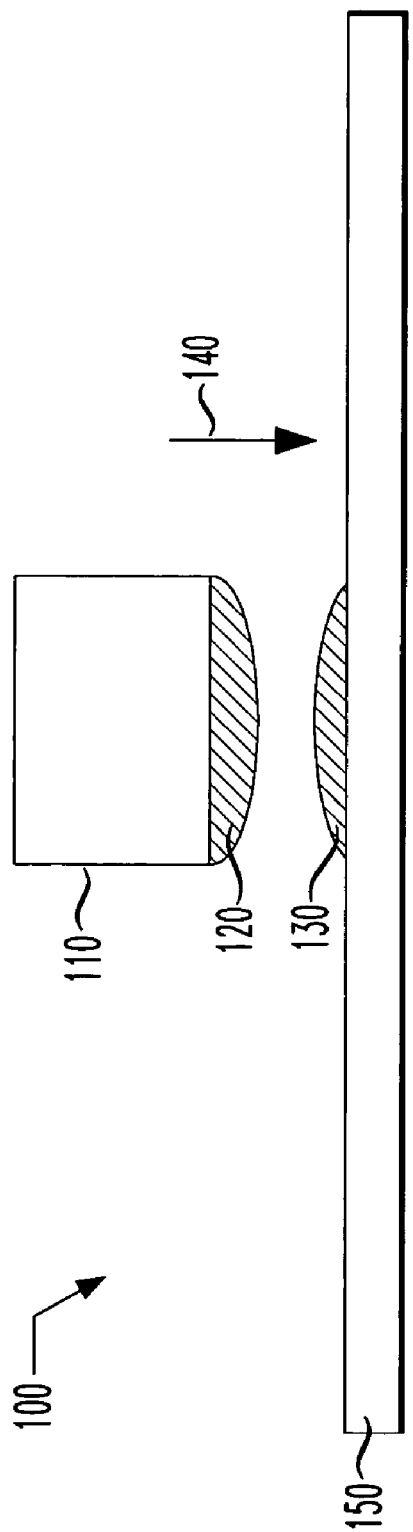
FIG. 1 illustrates a conventional method of forming a thermo-compression bond for use as a thermal or electrical interconnection.
Figure 2:
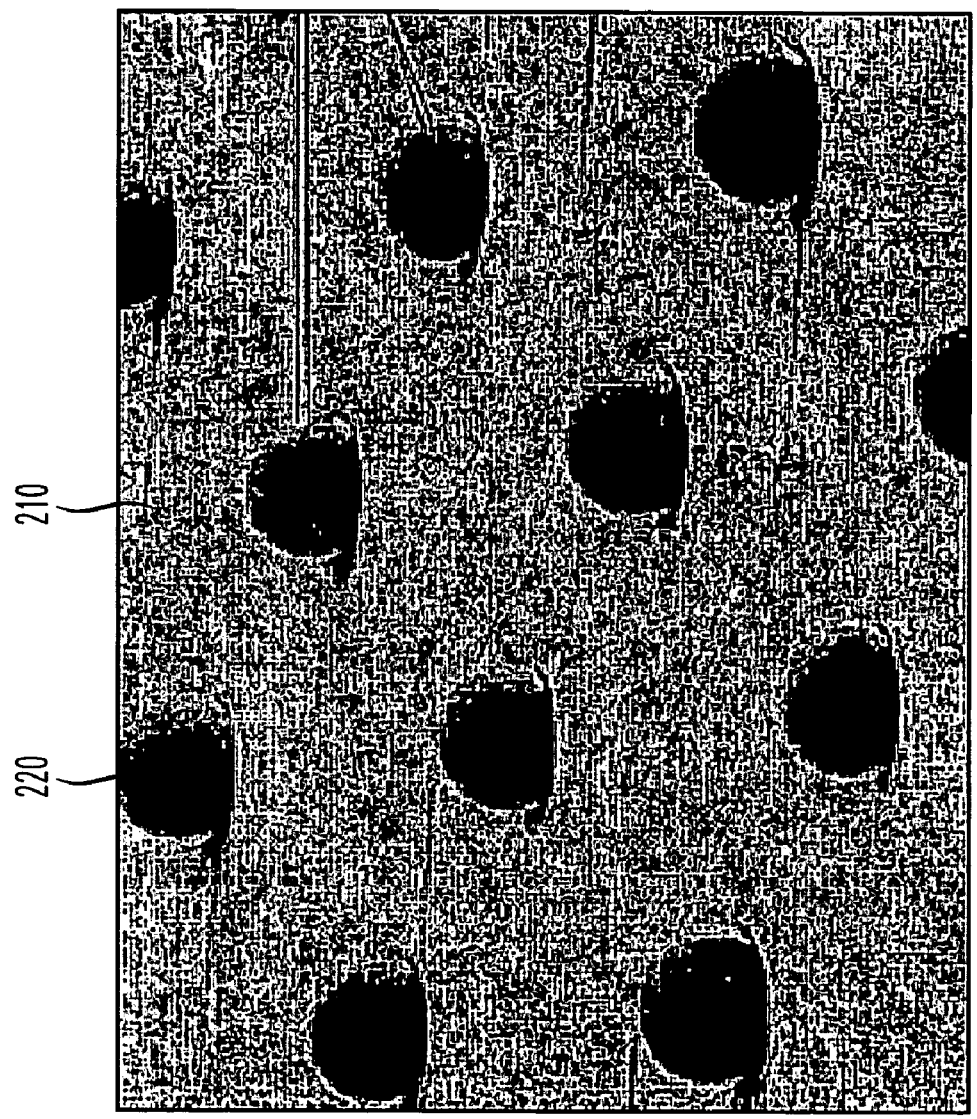
FIG. 2 illustrates another conventional method of thermally or electrically connecting two electronic components.
Figure 3:
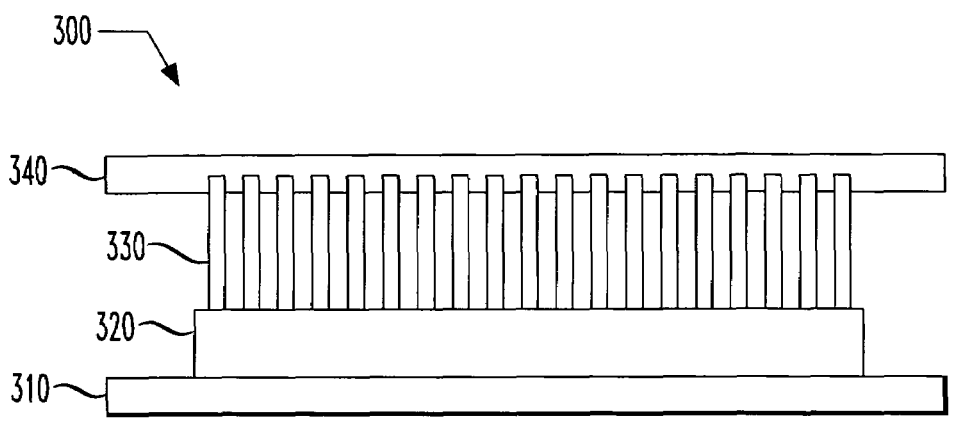
FIGS. 3-8 illustrate cross-sectional views of embodiments of an interconnect constructed in accordance with the principles of the present invention.

Turning now to FIG. 3 illustrated is a cross-sectional view of one embodiment an interconnect 300 constructed in accordance with the principles of the present invention. The interconnect 300 illustrated in FIG. 3 includes a first substrate 310. The first substrate 310, among many other materials, may comprise a silicon substrate. For instance, in the embodiment shown, the first substrate 310 is a conventional semiconductor chip upon which, or within which, numerous semiconductor devices have been formed.

Formed over the first substrate 310 in the embodiment of FIG. 3 is a pliable surface 320. As will be evident further below, the pliable surface 320 may comprise a variety of different materials and/or configurations and remain within the purview of the present invention. In the embodiment of FIG. 3, however, the pliable surface 320 comprise a material, such as a polymer, that provides it the flexibility to allow the plurality of nanostructures 330 formed thereover to at least partially conform to a rough surface 340 that it might come into contact with. One particularly useful polymer that might be used for the pliable surface 320 illustrated in FIG. 3 is a polymide. Another particularly useful polymer material that might be used for the pliable surface 320 illustrated in FIG. 3 is a fluoropolymer. Even though a couple of specific polymer materials have been provided, the options are abundant, and thus the present invention should not be limited to any specific material.

Disposed on the pliable surface 320 of FIG. 3 is a plurality of nanostructures 330, here nanoposts. Cylindrical nanopost arrays, such as those shown in FIG. 3, have been produced with each nanopost having a diameter of less than about 10 nm. One skilled in the art will recognize that there are many different illustrative arrangements (e.g., sizes, pitch and height) of nanoposts that can be produced using various methods, and that such various diameter nanoposts can be fashioned with different degrees of regularity. An illustrative method of producing nanoposts, found in U.S. Pat. No. 6,185, 961, titled "Nanopost arrays and process for making same," issued Feb. 13, 2001 to Tonucci, et al., is hereby incorporated by reference herein in its entirety. Nanoposts have been manufactured by various methods, such as by using a template to form the posts, by various means of lithography, and by various methods of etching.

As typically defined, a "nanostructure" is a predefined structure having at least one dimension of less than about one micrometer and a "microstructure" is a predefined structure having at least one dimension of less than about one millimeter. However, although the disclosed embodiments only refer to nanostructures, it is intended by the present inventors, and will be clear to those skilled in the art, that microstructures may be substituted in many cases. Accordingly, the present invention hereby defines nanostructures to include both structures that have at least one dimension of less than about one micrometer as well as those structures having at least one dimension less than about one millimeter.

The nanostructures 330 of FIG. 3 are, for example, posts of a polymer material. Accordingly, in those embodiments wherein the pliable surface 320 comprises a polymer material, as disclosed above, the nanostructures 330 and the pliable surface 320 may comprise the same polymer material. In the embodiment of FIG. 3, the nanostructures have, illustratively, a diameter of about 200 nm and a height of about two micrometers. The nanostructures 330 are, for example, disposed in an area having a cross-section width (e.g., which is, illustratively, a circular diameter or a length of a side of a square area) of about 10 micrometers. One skilled in the art will also recognize, in light of the teachings herein, that many suitable arrangements are equally advantageous.

In the embodiment wherein the nanostructures 330 are configured to provide electrical and/or thermal coupling between the first substrate 310 and the rough surface 340, the nanostructures 330 may be coated with a thin layer of gold or other material suitable for use as an electrical and/or thermal conductor. In an alternative embodiment, the nanostructures 330 may be coated with a thin layer of titanium/gold to vastly improve the thermal characteristics of the nanostructures 330. One skilled in the art will fully appreciate that many suitable materials may be selected to achieve the desired electrical and/or thermal conductivity of the nanostructures. One skilled in the art will also fully appreciate the processes that might be employed to make use of such electrical and/or thermal conductivity. For instance, vias may be formed in the pliable surface 320 to provide electrical and/or thermal connection between the thin conductive layer and the first substrate 310.

Positioned over the plurality of nanostructures 330, and in this embodiment at least partially in contact with the plurality of nanostructures 330, is the rough surface 340 having the degree of surface roughness. The rough surface 340 may comprise many different materials and configurations while staying within the purview of the present invention. For instance, in the embodiment shown in FIG. 3 the rough surface 340 is a package configured to protect the first substrate 310 from external conditions. Accordingly, the plurality of nanostructures 330 in the embodiment of FIG. 3 are configured to couple the semiconductor chip (e.g., the first substrate 310), whether it be physically, electrically, thermally or any combination thereof, to the package (e.g., the rough surface 340).

Advantageous to the present invention, the pliable surface 320 allows the plurality of nanostructures to at least partially conform to the degree of surface roughness of the rough surface 340 when the nanostructures 330 come into contact therewith. In one embodiment, the pliable surface 320 is configured in such a way as to accommodate a degree of roughness of up to about several microns, while providing the appropriate connection between the nanostructures 330 and the rough surface 340. In this embodiment, the appropriate connection may include an appropriate adhesion between the nanostructures 330 and the rough surface 340, whether it is by way of intermolecular forces, Van Der Waals forces, dipole-dipole forces or another mechanism. The appropriate connection may also include the appropriate conductive connection between the nanostructures 330 and the rough surface 340, whether it is electrical, thermal, or a combination thereof. Moreover, the appropriate connection may be both an appropriate adhesive connection and an appropriate conductive connection.

The adhesion force resulting from the above-described contact is relatively high since a large surface area of the nanostructures 330 is in contact with the rough surface 340. Such a high adhesion force is a result of both the friction force resulting between the nanoposts as well as intermolecular forces, such as well-known Van Der Waals forces, between the molecules of the nanoposts on the surface. Thus, adhesive interconnections suitable for use in connecting electronics components in electronics packages are formed.

Figure 4:
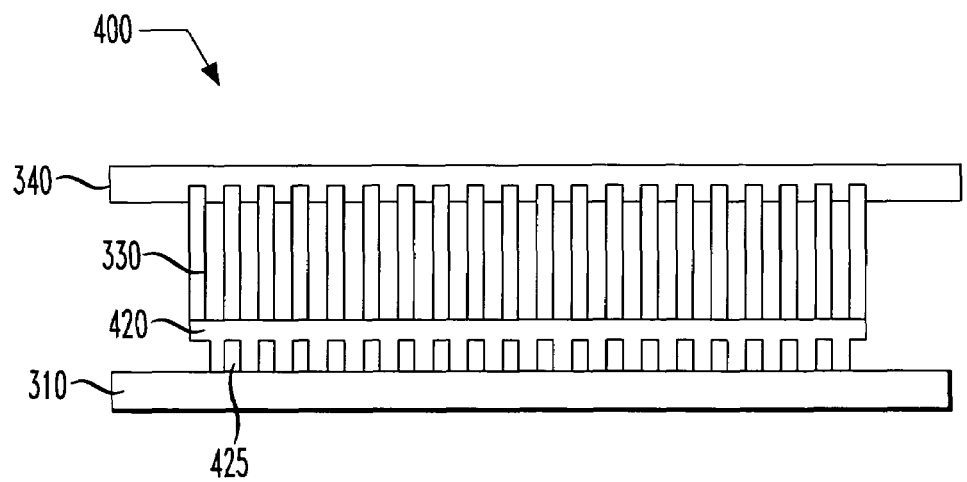

Turning now to FIG. 4, illustrated is a cross-sectional view of an alternative embodiment of an interconnect 400 manufactured in accordance with the principles of the present invention. The interconnect 400 of FIG. 4 is similar to the interconnect 300 of FIG. 3 with the exception that the pliable surface 420 of FIG. 4 is different from the pliable surface 320 of FIG. 3. Accordingly, reference numerals shared between FIGS. 3 and 4 indicate substantially similar features.

As is illustrated in FIG. 4, the pliable surface 420 of FIG. 4 includes one or more portions 425 etched there from. In this embodiment, the etched portions 425 may be used to provide increases flexibility of the pliable surface 420. For instance, in the embodiment above wherein the pliable surface 320 comprises a polymer, the etched portions 425 could be used to increase the flexibility of the already pliable polymer material. In an alternative embodiment, however, for instance an embodiment wherein the pliable surface 420 comprises a material that is less pliable than the polymer but has other advantageous features (e.g., better electrical or thermal conductive properties than the polymer material), the etched portions 425 could be used to create flexure points, and thus increase the flexibility of the pliable surface 420. One particular material that might benefit greatly from the etched portions 425, and thus the flexure points, might be silicon.

In the embodiment shown in FIG. 4, the etched portions 425 are located on an opposing side of the pliable surface 420 as the nanostructures 330. In this embodiment, the location, frequency, size, shape, etc. of the etched portions 425 may vary greatly. For instance, the etched portions 425 could be fully tailored for a specific purpose without substantial concern for the nanostructures 330 located on the opposing surface of the pliable surface 420. One skilled in the art will fully appreciate the processes that might be employed to create these etched portions 425, including using conventional photolithography and etching techniques, among others.

Figure 5:
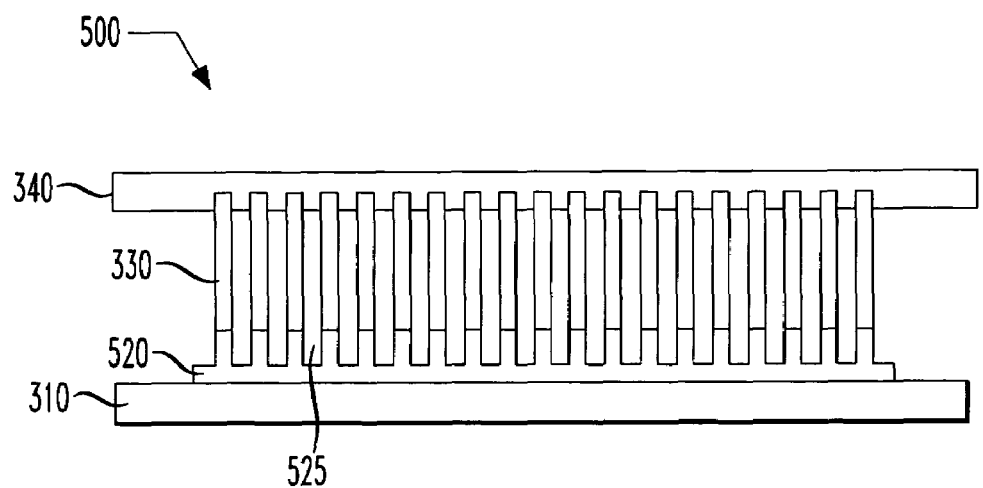

Turning briefly now to FIG. 5, illustrated is a cross-sectional view of an alternative embodiment of an interconnect 500 manufactured in accordance with the principles of the present invention. The interconnect 500 of FIG. 5 is substantially similar to the interconnect 400 of FIG. 4 with the exception that the etched portions 525 of the interconnect 500 are located on a same side of the pliable surface 520 as the nanostructures 330, as compared to the etched portions 425. Depending on the specifics of the pliable surface 520, the positioning of the etched portions 525 on the same side of the pliable surface 520 as the nanostructures 330 may provide increased flexibility over that illustrated in FIG. 4. Again, one skilled in the art will fully appreciate the processes that might be employed to create these etched portions 525, including the placement of the etched portions 525 between the nanostructures 330.

Figure 6:
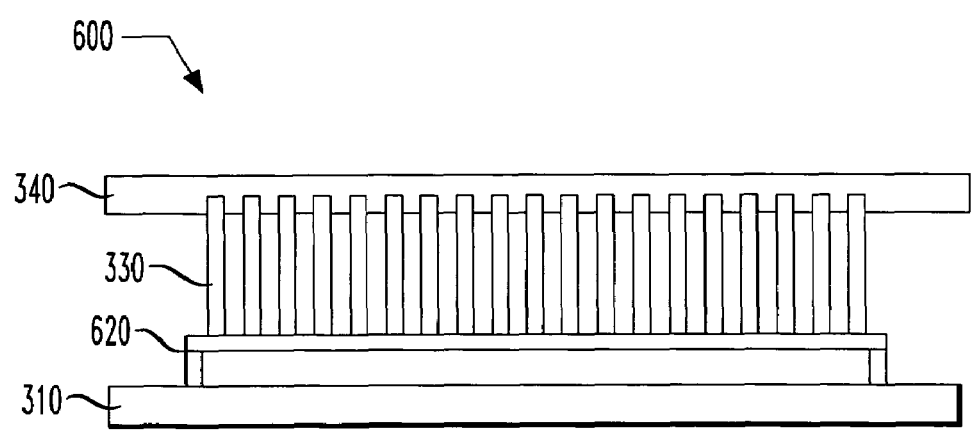

Turning now to FIG. 6, illustrated is a cross-sectional view of an alternative embodiment of an interconnect 600 manufactured in accordance with the principles of the present invention. The interconnect 600 of FIG. 6 is similar, at least in idea, to the interconnect 300 of FIG. 3. The interconnect 600 of FIG. 6, however, has its pliable surface 620 coupled to and at least partially suspended over the first substrate 310. In this embodiment, a gap between the pliable surface 620 and the first substrate 310 allows the pliable surface 620 to have improved pliability.

The interconnect 600 of FIG. 6 may be manufactured a number of different ways while staying within the scope of the present invention. For instance, in one embodiment, the pliable surface 620 is at least partially suspended over the first substrate 310 by forming a sacrificial spacer layer, such as silicon dioxide or silicon nitride, between the pliable surface 620 and the first substrate 310, and then selectively removing the sacrificial spacer layer to release the pliable surface 620 from the first substrate 310. In the embodiment shown, the pliable surface 620 is a thin layer of conductive material, such as a thin (e.g., approximately 25 to 50 micrometers) aluminum layer. While not illustrated, other materials and conventional techniques might also be used to form the interconnect 600 illustrated in FIG. 6.

Figure 7:
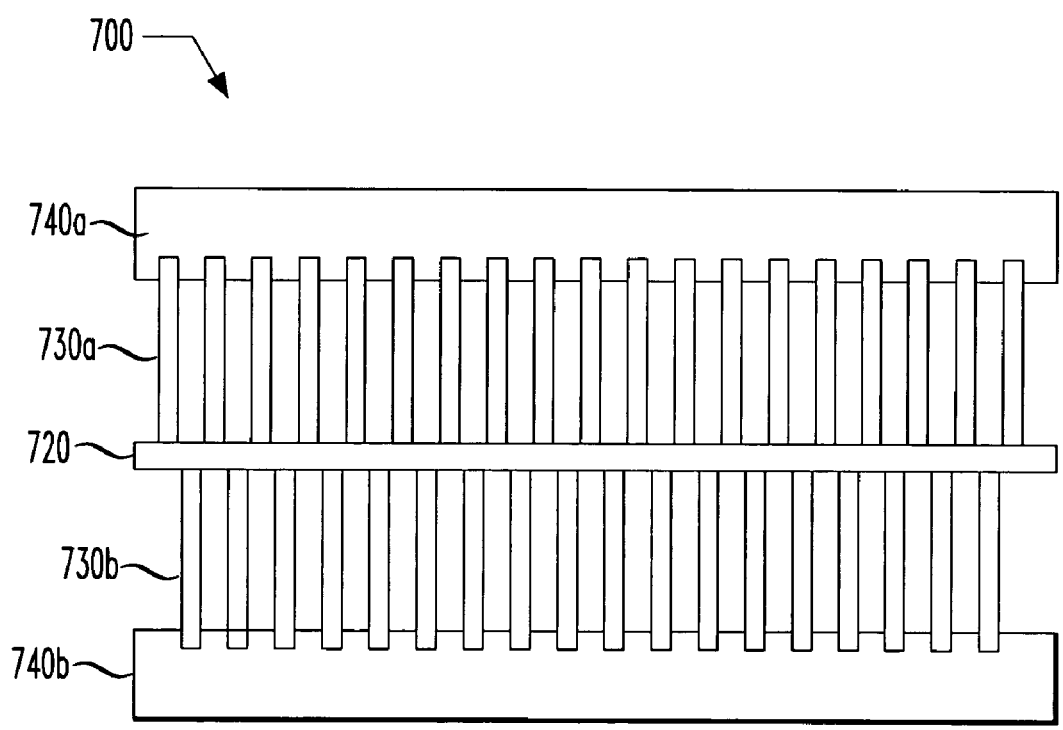

Turning now to FIG. 7, illustrated is a cross-sectional view of an alternative embodiment of an interconnect 700 manufactured in accordance with the principles of the present invention. The interconnect 700 of FIG. 7 includes a pliable surface 720 that may be similar to the pliable surface 320 illustrated and discussed with respect to FIG. 3. However, the pliable surface 720 of FIG. 7 has a first plurality of nanostructures 730a disposed on one side of the pliable surface 720 as well as a second plurality of nanostructures 730b disposed on an opposing side thereof. In the embodiment shown, the first and second plurality of nanostructures 730a, 730b are positioned so as to complement one another. It is believed that this complementary nature allows the first and second plurality of nanostructures 730a, 730b to accommodate increased surface roughness of any substrate that they may contact.

As is illustrated in FIG. 7, the first plurality of nanostructures 730a are at least partially coupled to a first substrate 740a and the second plurality of nanostructures 730b are at least partially coupled to a second substrate 740b. In the embodiment of FIG. 7, one or both of the first or second substrates 740a, 740b are a rough surface having a degree of surface roughness. Accordingly, the first and second plurality of nanostructures 730a, 730b disposed on the pliable surface 720 are configured to at least partially conform to the degree of surface roughness of one or both of the first and second substrates 740a, 740b. In contrast to the embodiments of FIGS. 3-6, the interconnect 700 of FIG. 7 uses the nanostructures 730a, 730b, and the attractive forces associated therewith, to couple to the first and second surfaces 740a, 740b, respectively. Those skilled in the art understand that processes similar to those used to manufacture the interconnect 300 of FIG. 3 could be used to manufacture the interconnect 700 of FIG. 7. Thus, no further detail is given.

Figure 8:
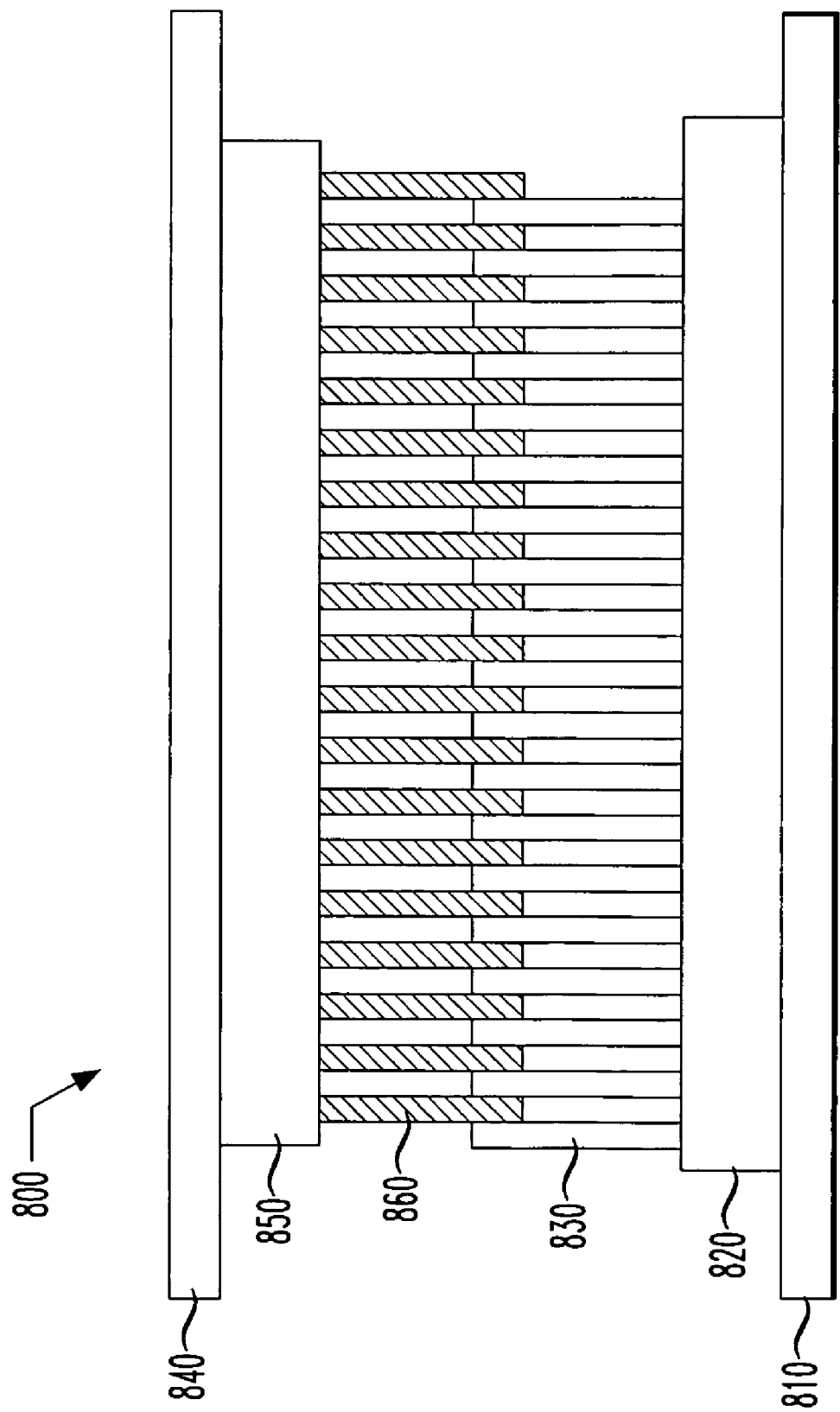

Turning finally to FIG. 8, illustrated is a cross-sectional view of an alternative embodiment of an interconnect 800 manufactured in accordance with the principles of the present invention. The interconnect of FIG. 8 includes a first substrate 810, a first pliable surface 820 coupled to the first substrate 810, a first plurality of nanostructures 830 coupled to the first pliable surface, as well as a second substrate 840, a second pliable surface 850 coupled to the second substrate 840 and a second plurality of nanostructures 860 coupled to the second pliable surface 850. In this embodiment, a surface roughness of the first substrate 810 may ultimately be transferred to the first plurality of nanostructures 830, and thus the second plurality of nanostructures 860 coupled to the second pliable surface 850 are configured to at least partially conform to the surface roughness of the first plurality of nanostructures 830. Just the same, a surface roughness of the second substrate 840 may ultimately be transferred to the second plurality of nanostructures 860, and thus the first plurality of nanostructures 830 coupled to the first pliable surface 820 are configured to at least partially conform to the surface roughness of the second plurality of nanostructures 860. Ultimately, the first and second plurality of nanostructures 830, 860, interleave with each other, the first and second pliable surfaces 820, 850, allowing the effects of any surface roughness of the first and second substrates 810, 840 to be substantially reduced.

Although the present invention has been described in detail, those skilled in the art should understand that they can make various changes, substitutions and alterations herein without departing from the spirit and scope of the invention in its broadest form.

What is claimed is:

1. An interconnect, comprising:
   a pliable surface having a plurality of nanostructures disposed thereon, a surface contacting at least a portion of the plurality of nanostructures, wherein the pliable surface is configured to allow the plurality of nanostructures to at least partially conform to the surface.

2. The interconnect as recited in claim 1 wherein the pliable surface is a substrate having portions etched there from to provide increased flexibility.

3. The interconnect as recited in claim 2 wherein the etched portions are located on an opposing side of the pliable surface as the nanostructures.

4. The interconnect as recited in claim 2 wherein the etched portions are located on a same side of the pliable surface as the nanostructures, the etched portions positioned between the nanostructures.

5. The interconnect as recited in claim 1 wherein the pliable surface is coupled to and at least partially suspended over a substrate.

6. The interconnect as recited in claim 1 wherein the pliable surface comprises a polymer.

7. The interconnect as recited in claim 1 wherein a conductive connection exists between the nanostructures and the surface.

8. The interconnect as recited in claim 7 wherein the conductive connection is thermal, electrical or both thermal and electrical.

9. The interconnect as recited in claim 1 wherein the plurality of nanostructures are a first plurality of nanostructures disposed on a side of the pliable surface, and further including a second plurality of nanostructures disposed on an opposing side of the pliable surface.

10. The interconnect as recited in claim 9 wherein the surface is a first surface and further including a second surface, and wherein the pliable surface is configured to allow the first plurality of nanostructures to at least partially conform to the first surface and the second plurality of nanostructures to at least partially conform to the second surface.

11. The interconnect as recited in claim 10 wherein attractive forces help at least a portion of the first plurality of nanostructures adhere to the first surface and at least a portion of the second plurality of nanostructures adhere to the second surface, the first and second surfaces being coupled to one another.

12. The interconnect as recited in claim 1 wherein attractive forces help at least a portion of the plurality of nanostructures adhere to the surface.

13. The interconnect as recited in claim 12 wherein the plurality of nanostructures are a first plurality of nanostructures and the surface is a second plurality of nanostructures.

14. The interconnect as recited in claim 12 wherein the attractive forces are selected from the group consisting of:
    intermolecular forces;
    Van Der Waals forces; and
    dipole-dipole forces.

15. The interconnect as recited in claim 1 wherein the surface is a rough surface having a degree of surface roughness, and the pliable surface is configured to allow the plurality of nanostructures to at least partially conform to the rough surface.

16. A method for interconnecting multiple surfaces, comprising:
    contacting a plurality of nanostructures disposed on a pliable surface with a surface, wherein the pliable surface is configured to allow the plurality of nanostructures to at least partially conform to the surface.

17. The method as recited in claim 16 wherein attractive forces help at least a portion of the plurality of nanostructures adhere to the surface.

18. The method as recited in claim 16 wherein a conductive connection exists between the nanostructures and the surface.

19. The method as recited in claim 18 wherein the conductive connection is thermal, electrical or both thermal and electrical.

20. The method as recited in claim 16 wherein the surface is a rough surface having a degree of surface roughness, and the pliable surface is configured to allow the plurality of nanostructures to at least partially conform to the rough surface.

* * * * *